United States Patent
Jo et al.

(10) Patent No.: US 12,078,683 B2
(45) Date of Patent: Sep. 3, 2024

(54) COMMUNICATION APPARATUS AND OPERATING METHOD THEREOF

(71) Applicant: LG ENERGY SOLUTION, LTD., Seoul (KR)

(72) Inventors: Young Chang Jo, Daejeon (KR); Hyun Ju Hong, Daejeon (KR); Sung Yul Yoon, Daejeon (KR); Jae Kwang Jeon, Daejeon (KR); Jeong Bin Lee, Daejeon (KR); Jae Sung Im, Daejeon (KR); Won Kyung Kim, Daejeon (KR); Won Bin Choi, Daejeon (KR); Myung Hyun Shim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 30 days.

(21) Appl. No.: 17/715,753

(22) Filed: Apr. 7, 2022

(65) Prior Publication Data

US 2022/0268844 A1    Aug. 25, 2022

(30) Foreign Application Priority Data

Feb. 19, 2021 (KR) .................. 10-2021-0022875

(51) Int. Cl.
  *G01R 31/367* (2019.01)
  *G01R 31/382* (2019.01)
(52) U.S. Cl.
  CPC ......... *G01R 31/367* (2019.01); *G01R 31/382* (2019.01)
(58) Field of Classification Search
  CPC ..................... G01R 31/367; G01R 31/382

USPC ........................................................ 702/63
See application file for complete search history.

(56) References Cited

U.S. PATENT DOCUMENTS

| | | | |
|---|---|---|---|
| 10,387,826 B2* | 8/2019 | Simmons | G06Q 10/087 |
| 2005/0027466 A1* | 2/2005 | Steinmetz | H04M 1/24 |
| | | | 702/63 |
| 2011/0099433 A1* | 4/2011 | Matsui | G06F 11/3062 |
| | | | 714/E11.179 |
| 2016/0169978 A1* | 6/2016 | Fukuhara | H02J 7/0047 |
| | | | 324/434 |
| 2019/0285703 A1* | 9/2019 | Juva | H02J 7/00047 |

FOREIGN PATENT DOCUMENTS

| | | |
|---|---|---|
| EP | 3 961 233 A1 | 3/2022 |
| JP | 2021-18876 A | 2/2021 |
| KR | 10-1051496 B1 | 7/2011 |
| KR | 10-1270871 B1 | 6/2013 |
| KR | 10-2015-0106027 A | 9/2015 |
| KR | 10-2017-0062050 A | 6/2017 |
| KR | 10-1769357 B1 | 8/2017 |
| KR | 10-2017-0112738 A | 10/2017 |
| KR | 10-1865086 B1 | 6/2018 |

(Continued)

*Primary Examiner* — Ricky Go
(74) *Attorney, Agent, or Firm* — Birch, Stewart, Kolasch & Birch, LLP (57) ABSTRACT

A communication apparatus includes a data collecting unit for obtaining log information about a state of a battery from a battery management system that manages the battery, a first storing unit including reference log information for determining abnormality of the battery, and a diagnosing unit for diagnosing abnormality of the battery by comparing the log information about the state of the battery with the reference log information.

11 Claims, 5 Drawing Sheets

(56) References Cited

FOREIGN PATENT DOCUMENTS

| KR | 10-1994828 B1 | 7/2019 |
| KR | 10-2045489 B1 | 11/2019 |
| KR | 10-2021-0004646 A | 1/2021 |
| KR | 10-2021-0011235 A | 2/2021 |
| KR | 10-2021-0014003 A | 2/2021 |

* cited by examiner

COMMUNICATION APPARATUS AND OPERATING METHOD THEREOF

CROSS REFERENCE TO RELATED APPLICATION

The present application claims priority to Korean Patent Application No. 10-2021-0022875, filed Feb. 19, 2021, the entire contents of which is incorporated herein for all purposes by this reference.

BACKGROUND OF THE INVENTION

Field of the Invention

Embodiments disclosed herein relate to a communication apparatus and an operating method thereof.

Description of the Related Art

Secondary batteries are generally used as battery racks including a battery module where a plurality of battery cells are connected to one another in series and/or in parallel. The battery rack may be managed and controlled by a battery management system in terms of a state and an operation. An energy storage system (ESS) including the battery rack mainly obtains key data through a personal computer (PC)-based battery management system and various sensors provided on the site. In the event of an emergency such as fire on such an ESS site, a manager needs to visit the site to manually back up data, consuming much time and cost, and in particular, when a battery management system provided inside a battery compartment is damaged by an accident such as a fire, etc., data is highly likely to be lost.

Moreover, even when a system for remotely collecting data without visit of the manager is established, data at a particular point of time at which an issue related to the accident is generated may not be entirely obtained in case of data transmission in a specific time unit. As such, data immediately before the accident, such as a black box of a vehicle, is most important in analyzing the cause of the accident, such that when data at the time of the accident is lost, a problem occurs in identifying an exact situation before and after the accident and great difficulty is inevitable in data analysis for a fundamental solution.

SUMMARY OF THE INVENTION

The present invention is proposed to solve these problems and aims to a communication apparatus and an operating method thereof to make it easy to identify a state of an accident and analyze a cause of the accident by rapidly securing stored data without a loss in the event of an emergency on a battery.

Moreover, embodiments disclosed herein aim to provide a communication apparatus and an operating method thereof to efficiently operate a response procedure for an accident by automating customer service registration and related procedures in case of the accident.

Technical problems of the embodiments disclosed herein are not limited to the above-described technical problems, and other unmentioned technical problems would be clearly understood by one of ordinary skill in the art from the following description.

A communication apparatus according to an embodiment disclosed herein includes a data collecting unit configured to obtain log information about a state of a battery from a battery management system that manages the battery, a first storing unit including reference log information for determining abnormality of the battery, and a diagnosing unit configured to diagnose abnormality of the battery by comparing the log information about the state of the battery with the reference log information.

According to an embodiment, the diagnosing unit may be configured to store state data of the battery for a certain period of time from a time of the diagnosing the abnormality of the battery in a second storing unit, in response to the diagnosing unit diagnosing the abnormality of the battery.

According to an embodiment, the diagnosing unit may be configured to compress the state data of the battery and store the compressed state data in the second storing unit, in response to the diagnosing unit diagnosing the abnormality of the battery.

According to an embodiment, the communication apparatus may further include a communicating unit configured to transmit state data of the battery for a certain period of time from a time of the diagnosing the abnormality of the battery to an outside, in response to the diagnosing unit diagnosing the abnormality of the battery.

According to an embodiment, the communicating unit may be configured to transmit the state data of the battery to a management server, in response to the diagnosing unit diagnosing the abnormality of the battery.

According to an embodiment, the communicating unit may be configured to transmit a notification message to a terminal of a user in response to the diagnosing unit diagnoses that abnormality occurs in the battery.

According to an embodiment, the communicating unit may be configured to transmit a manager registration request for repairing the battery having abnormality occurred to a customer service server, in response to the diagnosing unit diagnosing the abnormality of the battery.

According to an embodiment, the log information about the state of the battery may include event information about at least one of on/off states of the battery, charging/discharging states of the battery, and unstable behavior of the battery.

According to an embodiment, the log information about the state of the battery and the reference log information may include preset code information.

According to an embodiment, the log information about the state of the battery and the reference log information may have a format of a text list structure.

An operating method of a communication apparatus according to an embodiment disclosed herein may include obtaining log information about a state of a battery from a battery management system that manages the battery, comparing event log information about the state of the battery with reference log information for determining abnormality of the battery, the reference log information being stored in a first storing unit, and diagnosing abnormality of the battery based on a comparison between the log information about the state of the battery with the reference log information.

According to an embodiment, the operating method may further include storing state data of the battery for a certain period of time from a time of diagnosing abnormality of the battery in a second storing unit, in response to determining the abnormality of the battery.

According to an embodiment, the operating method may further include transmitting state data of the battery for a certain period of time from a time of diagnosing abnormality of the battery to an outside, in response to determining the abnormality of the battery.

According to an embodiment, the operating method may further include transmitting a notification message to a terminal of a user, in response to determining the abnormality of the battery.

According to an embodiment, the operating method may further include transmitting a manager registration request for repairing the battery having abnormality occurred to a customer service server, in response to determining the abnormality of the battery.

DETAILED DESCRIPTION OF THE INVENTION

Hereinafter, various embodiments disclosed herein will be described in detail with reference to the accompanying drawings. In this document, identical reference numerals will be used for identical components in the drawings, and the identical components will not be redundantly described.

For various embodiments disclosed herein, specific structural or functional descriptions are only exemplified for the purpose of describing the embodiments, and various embodiments disclosed herein may be implemented in various forms, and should not be construed as being limited to the embodiments described herein.

As used in various embodiments, the terms "$1^{st}$", "$2^{nd}$", "first", "second", or the like may modify various components regardless of importance, and do not limit the components. For example, a first component may be named as a second component without departing from the right scope of an embodiment disclosed herein, and similarly, the second component may be named as the first component.

Terms defined in the present disclosure are used for only describing a specific exemplary embodiment and may not have an intention to limit the scope of other exemplary embodiments. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some case, terms defined in the present disclosure cannot be analyzed to exclude embodiments disclosed herein.

Figure 1:
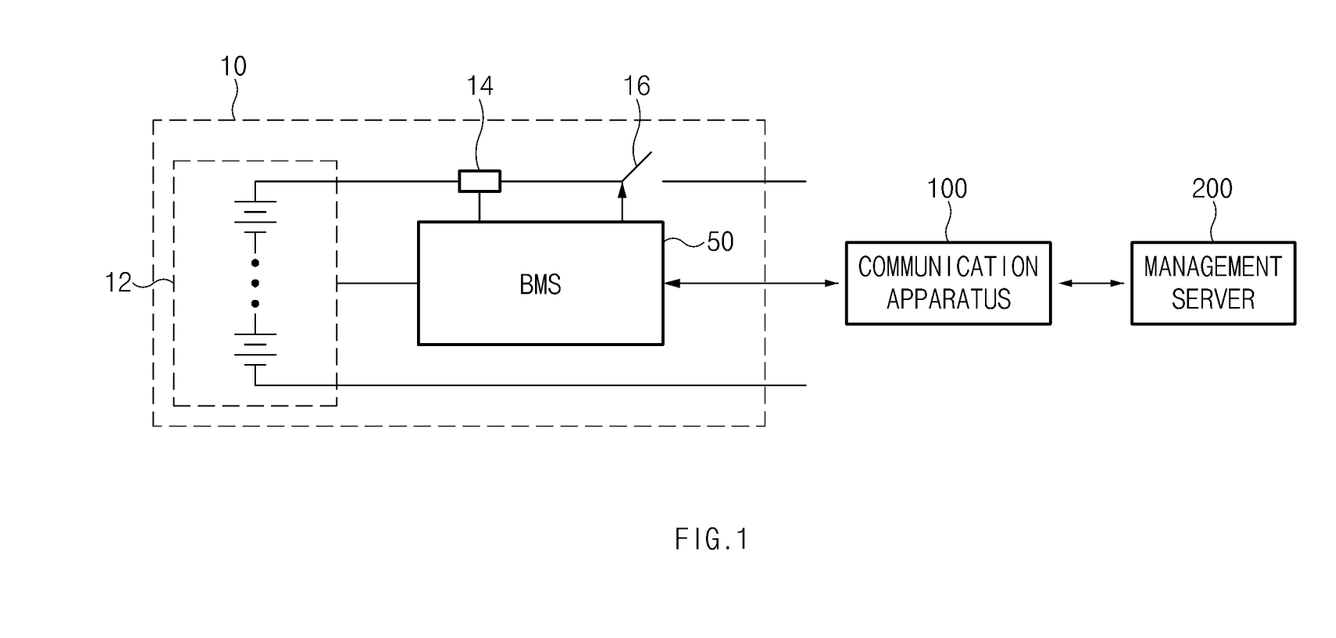
FIG. 1 is a diagram showing operations among a communication apparatus, a battery rack, and a management server, according to an embodiment disclosed herein.

FIG. 1 is a diagram showing operations among a communication apparatus, a battery rack, and a management server, according to an embodiment disclosed herein.

More specifically, FIG. 1 schematically shows mutual operations among a communication apparatus 100, a battery rack 10, and a management server 200, according to an embodiment disclosed herein. In this case, the battery rack 10 and the communication apparatus 100 may be wiredly or wirelessly connected to each other on an energy storage system (ESS) site, and the management server 200 may be connected to the communication apparatus 100 over a network.

As shown in FIG. 1, the battery rack 10 may include a plurality of battery modules 12, a sensor 14, a switching unit 16 (e.g., switch), and a battery management system (BMS) 50. The battery rack 10 may include the battery module 12, the sensor 14, the switching unit 16, and the battery management system 50 provided in plural.

The plurality of battery modules 12 may include one or more chargeable/dischargeable battery cells. In this case, the plurality of battery modules 12 may be connected in series or in parallel.

The sensor 14 may detect current flowing in the battery rack 10. In this case, a detected signal of current may be transmitted to the battery management system 50.

The switching unit 16 may be connected in series to a (+) terminal side or a (−) terminal side of the battery module 12 to control the charging/discharging current flow of the battery module 12. For example, the switching unit 16 may use at least one relay, a magnetic contactor, etc., according to the specifications of the battery rack 10.

The battery management system 50 may perform control and management to prevent overcharging and overdischarging, etc., by monitoring the voltage, current, temperature, etc., of the battery rack 10, and may include, for example, a rack battery management system (RBMS).

The battery management system 50, which is an interface for receiving measurement values of the above-described various parameter values, may include a plurality of terminals and a circuit, etc., connected thereto to process input values. The battery management system 50 may control on/off of the switching unit 16, e.g., a relay, a contactor, etc., and may be connected to the battery module 12 to monitor the state of each battery module 12.

Meanwhile, in the battery management system 50 disclosed herein, as will be described below, a log file generated in case of various events, e.g., on/off, charging/discharging, a failure, etc., of a battery, in the battery rack 10, may be transmitted to the communication apparatus 100. In this case, the communication apparatus 100 may store reference log file information indicating an emergency situation in a database. Therefore, the communication apparatus 100 may determine whether an emergency situation occurs on a current battery site by comparing the event log file received from the battery management system 50 with the reference log file information previously stored in the database.

Moreover, when the communication apparatus 100 determines that the emergency situation occurs on the battery site as a result of comparison between the event log file with the reference log file, the communication apparatus 100 may compress entire log data indicating a state of the battery rack 10 on the day of the emergency situation and transmit the compressed log data to the management server 200. Therefore, through the management server 200, a manager may recognize the current emergency situation and data before and after the emergency situation may be stored in a database (e.g., a big data server) to allow the manager to easily download the data later to analyze a cause of an accident.

Figure 2:
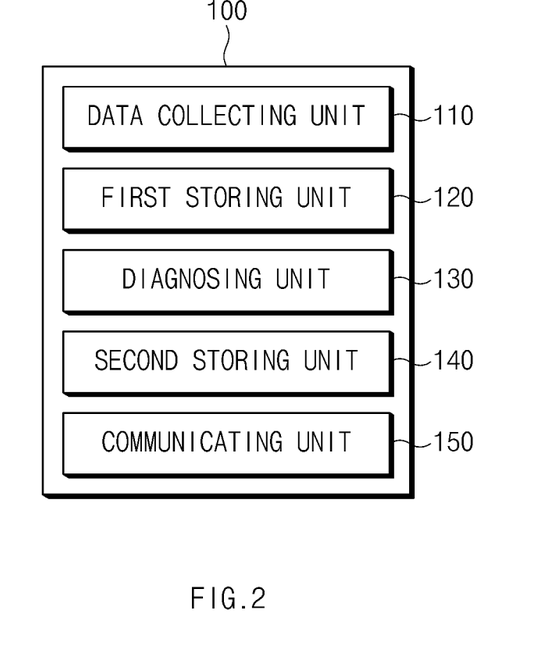
FIG. 2 is a block diagram showing a structure of a communication apparatus, according to an embodiment disclosed herein.

FIG. 2 is a block diagram showing a structure of a communication apparatus, according to an embodiment disclosed herein.

Referring to FIG. 2, the communication apparatus 100 according to an embodiment disclosed herein may include a data collecting unit 110, a first storing unit 120, a diagnosing unit 130, a second storing unit 140, and a communicating unit 150.

The data collecting unit 110 may obtain log information about a state of a battery from a battery management system that manages the battery. In this case, the log information about the state of the battery may include information included in an event log file automatically generated in case of various events such as on/off states of the battery, charging/discharging and idle states, an unstable behavior, etc., in the battery management system. For example, the event log file may include previously determined code information, such as FSS0, to indicate an event occurring in the battery.

The first storing unit 120 may include reference log information for determining abnormality of the battery. In this case, the reference log information may have the same format as the log information received from the battery management system. For example, the reference log information may include code information indicating the emergency situation of the battery. Moreover, the log information about the state of the battery and the reference log information may have a format of a text (txt) list structure instead of raw data (csv data) to rapidly determine the state and reduce a computation load. A user may access the first storing unit 120 as needed to update such reference log information.

The diagnosing unit 130 may compare the log information about the state of the battery with the reference log information to diagnose abnormality of the battery. That is, the diagnosing unit 130 may determine whether abnormality occurs in the battery by comparing the event log file received from the battery management system with the reference log file indicating the emergency situation of the battery, previously stored in the first storing unit 120.

When the diagnosing unit 130 diagnoses that abnormality of the battery occurs, the diagnosing unit 130 may store state data of the battery for a certain period of time from the time of diagnosing abnormality of the battery in the second storing unit 140. For example, when the diagnosing unit 130 diagnoses that abnormality of the battery occurs, the diagnosing unit 130 may receive entire battery log data on the day of diagnosing abnormality, compress the entire log data, and store the compressed battery log data in the second storing unit 140.

The second storing unit 140 may store the battery log data, stored by the diagnosing unit 130 each time of occurrence of abnormality of the battery. The entire battery log data stored in the second storing unit 140 may be transmitted to a management server for data capacity management and may be deleted after a specific time from the transmission.

When the diagnosing unit 130 diagnoses that abnormality of the battery occurs, the communicating unit 150 may transmit state data of the battery for a certain period of time from the time of diagnosing abnormality of the battery to an outside. For example, the communicating unit 150 may transmit the state data of the battery to the management server when the diagnosing unit 130 diagnoses that abnormality of the battery occurs. As such, when abnormality of the battery occurs, log data about the state of the battery before and after occurrence of abnormality is transmitted to the management server and stored, thereby preventing a data loss and allowing the manager to easily download the data from the management server and analyze the data.

Moreover, the communicating unit 150 may transmit a notification message to a terminal of the user when the diagnosing unit 130 diagnoses that abnormality of the battery occurs. For example, the communicating unit 150 may transmit notification in the form of a text message, an e-mail, etc., indicating that abnormality occurs in the battery. When the diagnosing unit 130 diagnoses that abnormality occurs in the battery, the communicating unit 150 may automatically transmit a manager registration request for repairing the battery having abnormality occurred to a customer service (CS) server. Thus, a response procedure after occurrence of abnormality in the battery may be simplified.

Meanwhile, the first storing unit 120 and the second storing unit 140 are separately shown in FIG. 2, but the communication apparatus 100 disclosed herein is not limited thereto, such that the first storing unit 120 and the second storing unit 140 may be configured as one storing unit.

As such, the communication apparatus 100 according to an embodiment disclosed herein may rapidly secure data stored in the event of the emergency situation of the battery without a loss, thereby making it easy to identify a state of an accident and analyze a cause of the accident.

Moreover, the communication apparatus 100 according to an embodiment disclosed herein may efficiently operate a response procedure for an accident by automating CS registration and related procedures in the event of the accident.

Figure 3:
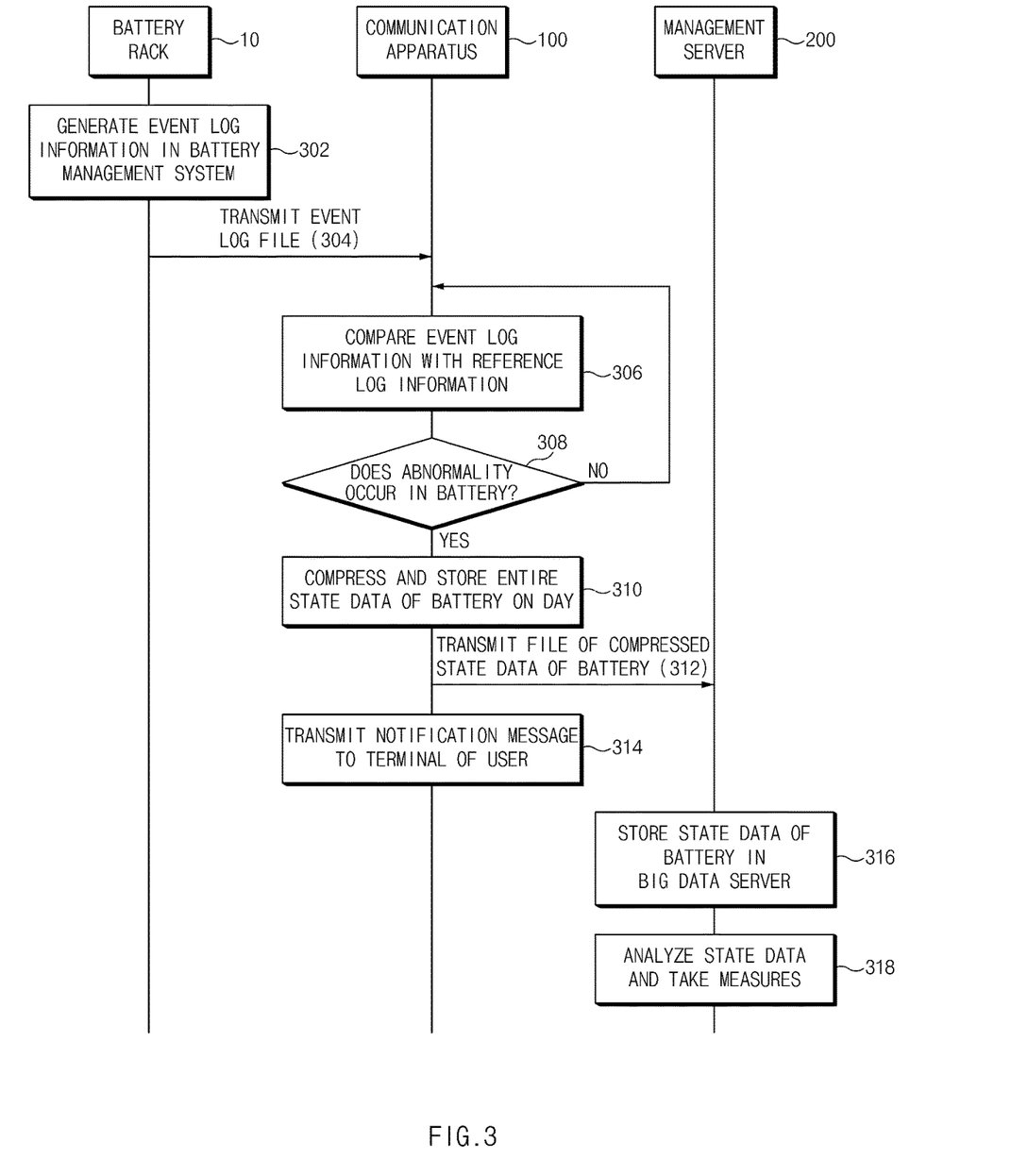
FIG. 3 is a diagram showing operations of a communication apparatus and a management server, according to an embodiment disclosed herein.

FIG. 3 is a diagram showing operations of a communication apparatus and a management server, according to an embodiment disclosed herein.

Referring to FIG. 3, the battery management system 50 of the battery rack 10 may detect state information of a battery at specific intervals. For example, the state information of the battery rack 10 may include measurement values such as voltage, current, temperature, etc., of the battery, event information about on/off, charging/discharging, idle operation, occurrence of a failure, etc., of the battery, and so forth. That is, the battery management system 50 of the battery rack 10 may generate an event log file including unique information corresponding to an event when the event occurs in the battery rack 10, in operation 302.

The battery management system 50 may transmit the generated event log file of the battery to the communication apparatus 100, in operation 304. The communication apparatus 100 may compare log information included in the event log file received from the battery management system 50 with reference log information previously stored in a database (the first storing unit 120 of FIG. 2), in operation 306. For example, the reference log information may include preset code information as log information indicating that abnormality occurs in the battery. In this case, the reference log information may have the same format as the log information included in the event log file.

When the event log information received from the battery management system 50 does not match the reference log information stored in the database (NO) in operation 308, the communication apparatus 100 may continue receiving the event log file from the battery management system 50.

When the event log information received from the battery management system 50 matches the reference log information stored in the database (YES) in operation 308, the communication apparatus 100 may determine that abnormality occurs in the battery. The communication apparatus 100 may compress the state data (log data) of the entire battery rack on the day of occurrence of abnormality and store the compressed state data in a database (e.g., the second storing unit 140 of FIG. 2), in operation 310. Next, the communication apparatus 100 may immediately transmit the compressed state data of the battery to the management server 200, in operation 312.

When the communication apparatus 100 determines that abnormality occurs in the battery as a result of comparing the event log information of the battery with the reference log information in operation 308, the communication apparatus 100 may immediately transmit a notification message in the form of a short message service (SMS) message, an e-mail, etc., to a terminal of the user, in operation 314. Thus, a manager of the battery system may immediately recognize occurrence of a failure and take appropriate measures thereto.

Meanwhile, it is shown in FIG. 3 that the communication apparatus 100 transmits a notification message to the terminal of the user, but after the communication apparatus 100 disclosed herein transmits state data of the battery to the management server 200, the notification message may be transmitted to the terminal of the user from the management server 200.

Next, the management server 200 may store the file of the state data of the battery, received from the communication apparatus 100, in a big data server, in operation 316. Thus, the manager may analyze a cause of abnormality of the battery based on the state data of the battery stored in the big data server and take measures to abnormality, in operation 318.

Meanwhile, although not shown in FIG. 3, the communication apparatus 100 disclosed herein may communicate with a cloud server (not shown). The cloud server may temporarily store the compressed file of the state data of the battery, received from the communication apparatus 100, and transmit the compressed file of the state data of the battery to the management server 200, in operation 318. As such, the cloud server may serve as a buffer between a battery installation site including the battery rack and the communication apparatus 100 and the management server 200. That is, the cloud server may secure stability for data transmission by preventing speed delay or data loss depending on a physical position of the management server 200 provided on a private network. For example, the cloud server may prevent a communication delay between a management server located in Korea and a battery site located in a foreign country.

Moreover, although not shown in FIG. 3, the management server 200 may include an extract, transform, load (ETL) server, a big data server, and a web server. For example, the ETL server may extract the state data of the battery received from the communication apparatus 100 and perform transformation (e.g., the ETL server performs time reversal removal, redundant data removal, time unit setting, file format conversion, etc.) into an analyzable form. The big data server may store state data of the battery and perform big data modeling analysis based on the state data of the battery, thereby diagnosing a failure of the battery in advance. The web server may display the state information of the battery to the user. That is, the web server may display the state data of the battery, failure diagnosis result information, etc., through a user interface (UI).

In this way, according to the communication apparatus disclosed herein, abnormality of the battery may be early detected on a battery installation site provided with a battery rack rather than on a server stage to transmit log data on the day of an accident to a network before a battery system burns out or loses power upon occurrence of the accident, thereby preventing a loss of data. Moreover, upon occurrence of the accident, the notification message may be transmitted to the user terminal, allowing the manager to immediately recognize occurrence of the accident, and a response procedure may be automated by automatic registration in a CS server.

Figure 4:
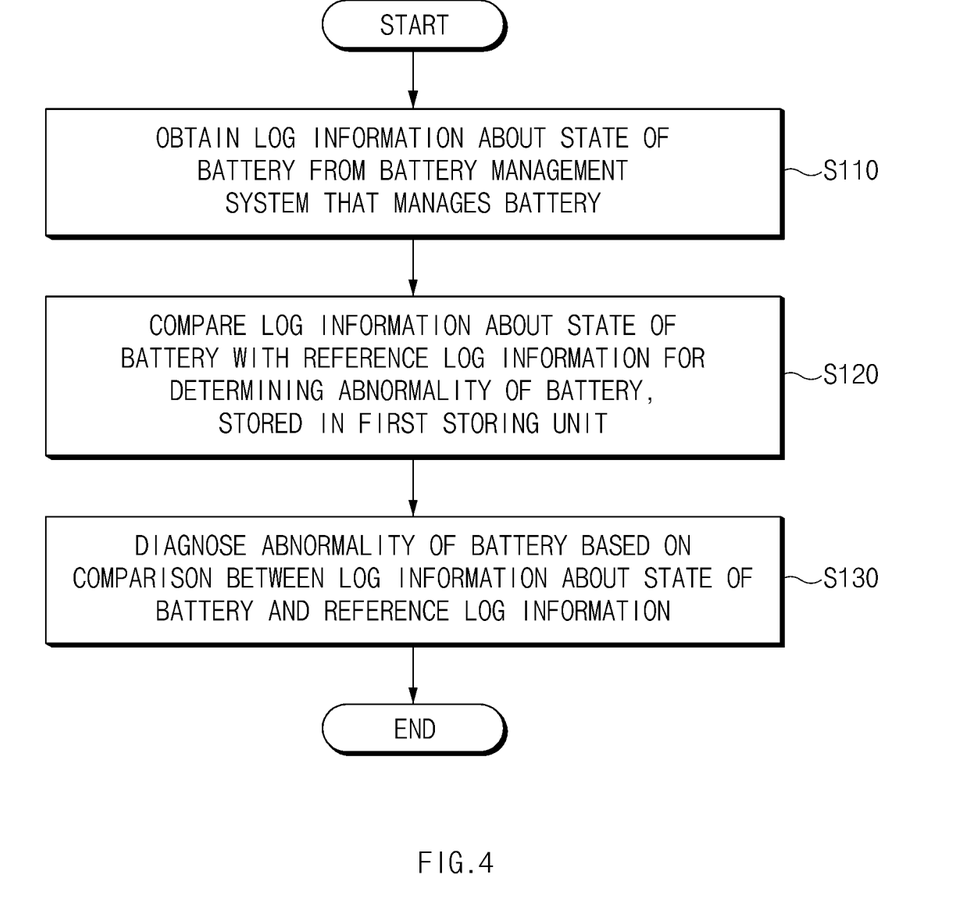
FIG. 4 is a flowchart showing an operating method of a communication apparatus, according to an embodiment disclosed herein.

FIG. 4 is a flowchart showing an operating method of a communication apparatus, according to an embodiment disclosed herein.

Referring to FIG. 4, an operating method of a communication apparatus according to an embodiment disclosed herein may obtain log information about a state of a battery from a battery management system that manages the battery, in operation S110. In this case, the log information about the state of the battery may include information included in an event log file automatically generated in case of various events such as on/off states of the battery, charging/discharging and idle states, an unstable behavior, etc., in the battery management system. For example, the event log file may include previously determined code information, such as FSS0, to indicate an event occurring in the battery.

The event log information about the state of the battery may be compared with reference log information for determining abnormality of the battery, stored in the first storing unit, in operation S120. In this case, the reference log information may have the same format as the log information received from the battery management system. For example, the reference log information may include code information indicating the emergency situation of the battery. Moreover, the log information about the state of the battery and the reference log information may have a format of a text list structure instead of raw data to rapidly determine the state and reduce a computation load. The user may access the first storing unit as needed to update such reference log information.

Next, abnormality of the battery may be diagnosed based on comparison between the log information about the state of the battery and the reference log information. More specifically, in operation S130, it may be determined whether abnormality occurs in the battery by comparing the event log file received from the battery management system with the reference log file indicating the emergency situation of the battery, previously stored in the first storing unit.

Meanwhile, although not shown in FIG. 4, the operating method of the communication apparatus according to an embodiment disclosed herein may further include storing state data of the battery for a specific time from the time of diagnosing abnormality when it is diagnosed that abnormality occurs in the battery. For example, when it is diagnosed that abnormality of the battery occurs, entire battery log data on the day of diagnosing abnormality may be received from the battery management system and may be compressed and stored in the second storing unit.

The operating method of the communication apparatus according to an embodiment disclosed herein may further include transmitting state data of the battery for a specific time from the time of diagnosing abnormality to an outside, when it is diagnosed that abnormality occurs in the battery in operation S130. For example, the state data of the battery may be transmitted to the management server when it is diagnosed that abnormality of the battery occurs. As such, when abnormality of the battery occurs, log data about the state of the battery before and after occurrence of abnormality is transmitted to the management server and stored, thereby preventing a data loss and allowing the manager to easily download the data from the management server and analyze the data.

The operating method of the communication apparatus according to an embodiment disclosed herein may further include transmitting a notification message to the terminal of the user, when it is diagnosed that abnormality occurs in the battery in operation S130. For example, notification may be transmitted in the form of a text message, an e-mail, etc., indicating that abnormality occurs in the battery. A manager registration request may be automatically transmitted to a CS server to repair the battery having abnormality occurred. Thus, a response procedure after occurrence of abnormality in the battery may be simplified.

As such, the operating method of the communication apparatus according to an embodiment disclosed herein may rapidly secure data stored in the event of the emergency situation of the battery without a loss, thereby making it easy to identify a state of an accident and analyze a cause of the accident.

Moreover, the operating method of the communication apparatus according to an embodiment disclosed herein may efficiently operate a response procedure for an accident by automating CS registration and related procedures in the event of the accident.

Figure 5:
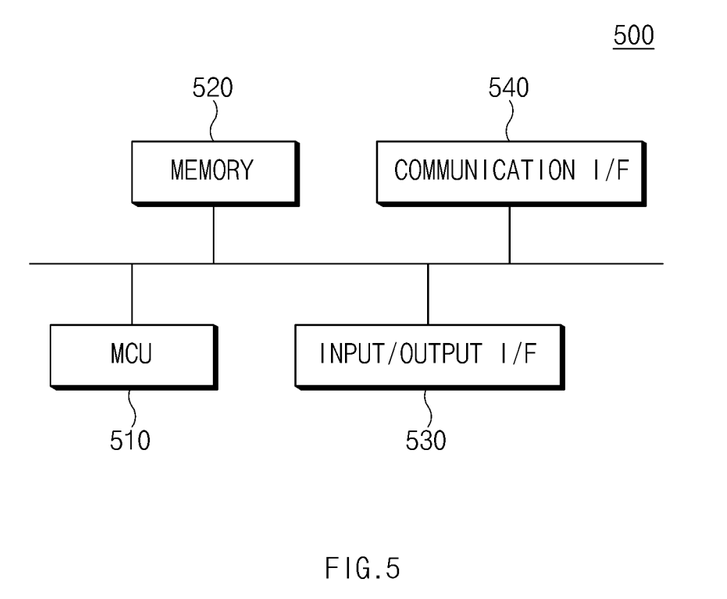
FIG. 5 is a diagram showing a hardware configuration of a computing system for performing an operating method of a communication apparatus, according to an embodiment disclosed herein.

FIG. 5 is a diagram showing a hardware configuration of a computing system for performing an operating method of a communication apparatus, according to an embodiment disclosed herein.

Referring to FIG. 5, a computing system 500 according to an embodiment disclosed herein may include a microcontroller unit (MCU) 510, a memory 520, an input/output interface (I/F) 530, and a communication I/F 540.

The MCU 510 may be a processor that executes various programs (e.g., a battery event log file collection program, a log information comparison and diagnosis program, etc.) stored in the memory 520, processes various data including an event log file, log data, etc., of the battery through these programs, and executes the above-described functions of the communication apparatus shown in FIG. 2.

The memory 520 may store various programs regarding log information collection and diagnosis of the battery, etc. Moreover, the memory 520 may store various data such as event log information, reference log information, log data, etc., of the battery.

The memory 520 may be provided in plural, depending on a need. The memory 520 may be a volatile memory or a nonvolatile memory. For the memory 520 as the volatile memory, random access memory (RAM), dynamic RAM (DRAM), static RAM (SRAM), etc., may be used. For the memory 520 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 520 are merely examples and are not limited thereto.

The input/output I/F 530 may provide an interface for transmitting and receiving data by connecting an input device (not shown) such as a keyboard, a mouse, a touch panel, etc., and an output device such as a display (not shown), etc., with the MCU 510.

The communication I/F 540, which is a component capable of transmitting and receiving various data to and from a server, may be various types of devices capable of supporting wired or wireless communication. For example, a program for event log file collection and diagnosis of the battery or various data may be transmitted and received to and from a separately provided external server through the communication I/F 540.

As such, a computer program according to an embodiment disclosed herein may be recorded in the memory 520 and processed by the MCU 510, thus being implemented as a module that performs functions shown in FIG. 2.

The communication apparatus and the operating method thereof according to an embodiment disclosed herein may rapidly secure data stored in the event of the emergency situation of the battery without a loss, thereby making it easy to identify a state of an accident and analyze a cause of the accident.

Moreover, the communication apparatus and the operating method thereof according to an embodiment disclosed herein may efficiently operate a response procedure for an accident by automating CS registration and related procedures in the event of the accident.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the technical idea of the present disclosure, and various modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

The invention claimed is:

1. A communication apparatus comprising:
   a memory configured to store a plurality of programs, the plurality of programs including:
     a data collecting unit configured to obtain log information about a state of a battery from a battery management system that manages the battery;
     a first storing unit comprising reference log information for determining an abnormality of the battery;
     a diagnosing unit configured to:
       diagnose the abnormality of the battery by comparing the log information about the state of the battery with the reference log information, and compress the log information for a certain period based on a time of abnormality diagnosis;

a second storing unit configured to store the compressed log information; and a communicating unit configured to, in response to diagnosing the abnormality of the battery, transmit a request to repair the battery, wherein the communicating unit is configured to transmit the compressed log information to a management server, in response to the diagnosing unit diagnosing the abnormality of the battery, so that the management server recognizes a current emergency situation based on the log information being compressed, and wherein the second storing unit is configured to delete the compressed log information after the compressed log information is transmitted to the management server; and a processor configured to execute the plurality of programs.

2. The communication apparatus of claim 1, wherein the diagnosing unit is configured to store state data of the battery for a certain period of time from a time of the diagnosing the abnormality of the battery in the second storing unit, in response to the diagnosing unit diagnosing the abnormality of the battery.

3. The communication apparatus of claim 2, wherein the diagnosing unit is configured to compress the state data of the battery and store the compressed state data in the second storing unit, in response to the diagnosing unit diagnosing the abnormality of the battery.

4. The communication apparatus of claim 1, wherein the communicating unit is configured to transmit a notification message to a terminal of a user, in response to the diagnosing unit diagnosing the abnormality of the battery.

5. The communication apparatus of claim 1, wherein the communicating unit is configured to transmit a manager registration request for repairing the battery having abnormality occurred to a customer service server, in response to the diagnosing unit diagnosing the abnormality of the battery.

6. The communication apparatus of claim 1, wherein the log information about the state of the battery comprises event information about at least one of on/off states of the battery, charging/discharging states of the battery, and unstable behavior of the battery.

7. The communication apparatus of claim 1, wherein the log information about the state of the battery and the reference log information comprise preset code information.

8. The communication apparatus of claim 1, wherein the log information about the state of the battery and the reference log information have a format of a text list structure.

9. An operating method of a communication apparatus, the operating method comprising:

obtaining log information about a state of a battery from a battery management system that manages the battery;

comparing the log information about the state of the battery with reference log information for determining an abnormality of the battery, the reference log information being stored in a first storing unit;

diagnosing the abnormality of the battery based on a comparison between the log information about the state of the battery with the reference log information;

compressing the log information for a certain period based on a time of abnormality diagnosis and storing the log information in a second storing unit, in response to diagnosing the abnormality;

transmitting a request to repair the battery, in response to diagnosing the abnormality;

transmitting the compressed log information to a management server, in response to diagnosing the abnormality of the battery, so that the management server recognizes a current emergency situation based on the log information being compressed; and deleting the compressed log information after the compressed log information is transmitted to the management server.

10. The operating method of claim 9, further comprising storing state data of the battery for a certain period of time from a time of diagnosing the abnormality of the battery in the second storing unit, in response to determining the abnormality of the battery.

11. The operating method of claim 9, further comprising transmitting a notification message to a terminal of a user, in response to determining the abnormality of the battery.

* * * * *